US008400834B2

(12) United States Patent
Yeung et al.

(10) Patent No.: US 8,400,834 B2
(45) Date of Patent: Mar. 19, 2013

(54) E/P DURABILITY BY USING A SUB-RANGE OF A FULL PROGRAMMING RANGE

(75) Inventors: Kwok W. Yeung, Milpitas, CA (US); Meng-Kun Lee, Cupertino, CA (US)

(73) Assignee: Link_A_Media Devices Corporation, Santa Clara, CA (US)

( * ) Notice: Subject to any disclaimer, the term of this patent is extended or adjusted under 35 U.S.C. 154(b) by 0 days.

(21) Appl. No.: 13/295,973

(22) Filed: Nov. 14, 2011

(65) Prior Publication Data

US 2012/0081971 A1    Apr. 5, 2012

Related U.S. Application Data

(63) Continuation of application No. 13/018,152, filed on Jan. 31, 2011, now Pat. No. 8,077,518, which is a continuation of application No. 12/286,104, filed on Sep. 26, 2008, now Pat. No. 7,903,462.

(60) Provisional application No. 61/123,082, filed on Apr. 4, 2008.

(51) Int. Cl.
*G11C 16/06*    (2006.01)

(52) U.S. Cl. ......... 365/185.17; 365/185.24; 365/185.29; 365/185.33

(58) Field of Classification Search .............. 365/185.17, 365/185.24, 185.29, 185.33
See application file for complete search history.

(56) References Cited

U.S. PATENT DOCUMENTS 6,185,134 B1 *    2/2001    Tanaka ..................... 365/185.33

* cited by examiner

*Primary Examiner* — Thong Q Le
(74) *Attorney, Agent, or Firm* — Van Pelt, Yi & James LLP

(57) ABSTRACT

A NAND Flash memory controller is used to perform an erase operation on a NAND Flash memory chip including to a cell on the NAND Flash memory chip; the cell is configured to store a first number of bits. It is determined whether the erase operation performed on the NAND Flash memory chip is successful. In the event it is determined that the erase operation performed on the NAND Flash memory chip is unsuccessful, the number of bits stored by the cell is reduced from the first number of bits to a second number of bits; the second number of bits is strictly less than the first number of bits.

20 Claims, 14 Drawing Sheets

US 8,400,834 B2

E/P DURABILITY BY USING A SUB-RANGE OF A FULL PROGRAMMING RANGE

CROSS REFERENCE TO OTHER APPLICATIONS

This application is a continuation of co-pending U.S. patent application Ser. No. 13/018,152, entitled E/P DURABILITY BY USING A SUB-RANGE OF A FULL PROGRAMMING RANGE filed Jan. 31, 2011 which is incorporated herein by reference for all purposes, which is a continuation of U.S. patent application Ser. No. 12/286,104, entitled E/P DURABILITY BY USING A SUB-RANGE OF A FULL PROGRAMMING RANGE filed Sep. 26, 2008, now U.S. Pat. No. 7,903,462, which is incorporated herein by reference for all purposes, which claims priority to U.S. Provisional Application No. 61/123,082, entitled E/P DURABILITY BY USING A SUB-RANGE OF A FULL PROGRAMMING RANGE filed Apr. 4, 2008 which is incorporated herein by reference for all purposes.

BACKGROUND OF THE INVENTION

Flash memory is a type of re-programmable, non-volatile storage and includes NAND flash memory and NOR flash memory. NAND flash memory is used, for example, in memory cards and Universal Serial Bus (USB) "thumb" drives. NAND flash memory is programmed (i.e., written to) using tunnel injection (also referred to as "tunneling in") and is erased using tunnel release (also referred to as "tunneling out"). NAND flash memory systems cannot be erased in a random access manner although they can be programmed in a random access manner.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
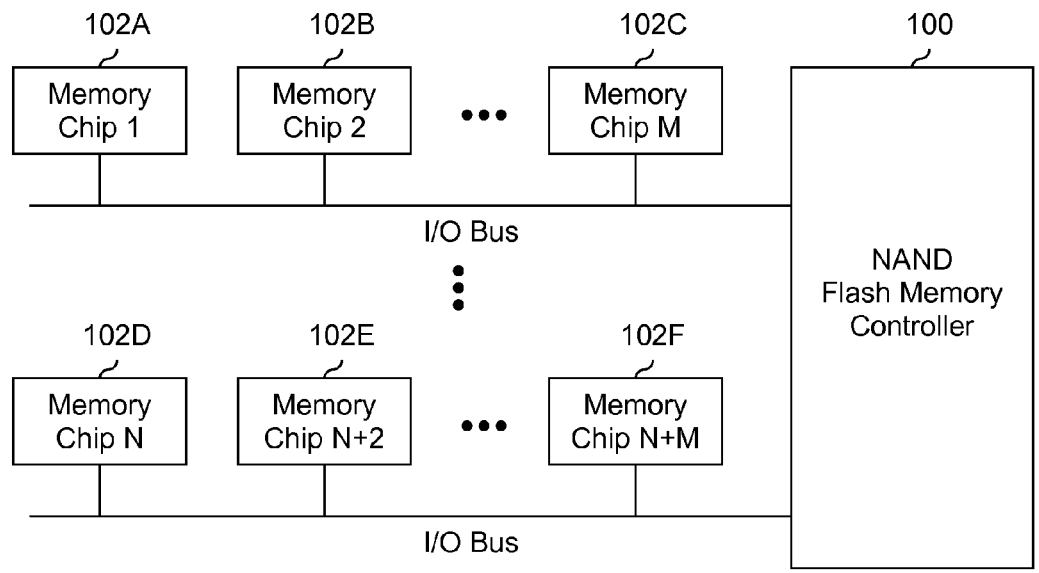
FIG. 1 is a diagram illustrating an embodiment of a NAND flash memory system.

FIG. 1 is a diagram illustrating an embodiment of a NAND flash memory system. In the example shown, the system includes NAND flash memory controller 100 and a plurality of memory chips 102a-102f. A first group of memory chips (102a-102c) are on one I/O bus and a second group of memory chips (102d-102f) are on another I/O bus. In this particular example, there are a total of N+M memory chips and each I/O bus connects M memory chips to controller 100. Each memory chip in this example includes a plurality of blocks. A block is one example of a portion of a NAND flash memory chip. In some configurations, there are ~2000 blocks per memory chip.

Controller 100 issues various commands or instructions along the I/O buses. One example command includes programming (i.e., writing to) some address or location in a particular memory chip. Another example command is an erase command. Other example commands include management or control commands, such as changing or setting a register, variable, or other option associated with a memory chip. In some examples described herein, an erase operation is only able to be performed at the block level, whereas a program operation can be performed at a lower level (e.g., at the cell level).

In some embodiments, different components are manufactured by different companies. For example, one company may manufacture memory chips 102a-102f and another company may manufacture controller 100. In some embodiments, an I/O bus, pinout, registers, or other interface between a memory chip and a controller is standardized to make it easier for components from different manufacturers to interoperate properly. For example, a NAND flash memory system may conform to the interface specified by the Open NAND Flash Interface Working Group (ONFI).

Figure 2:
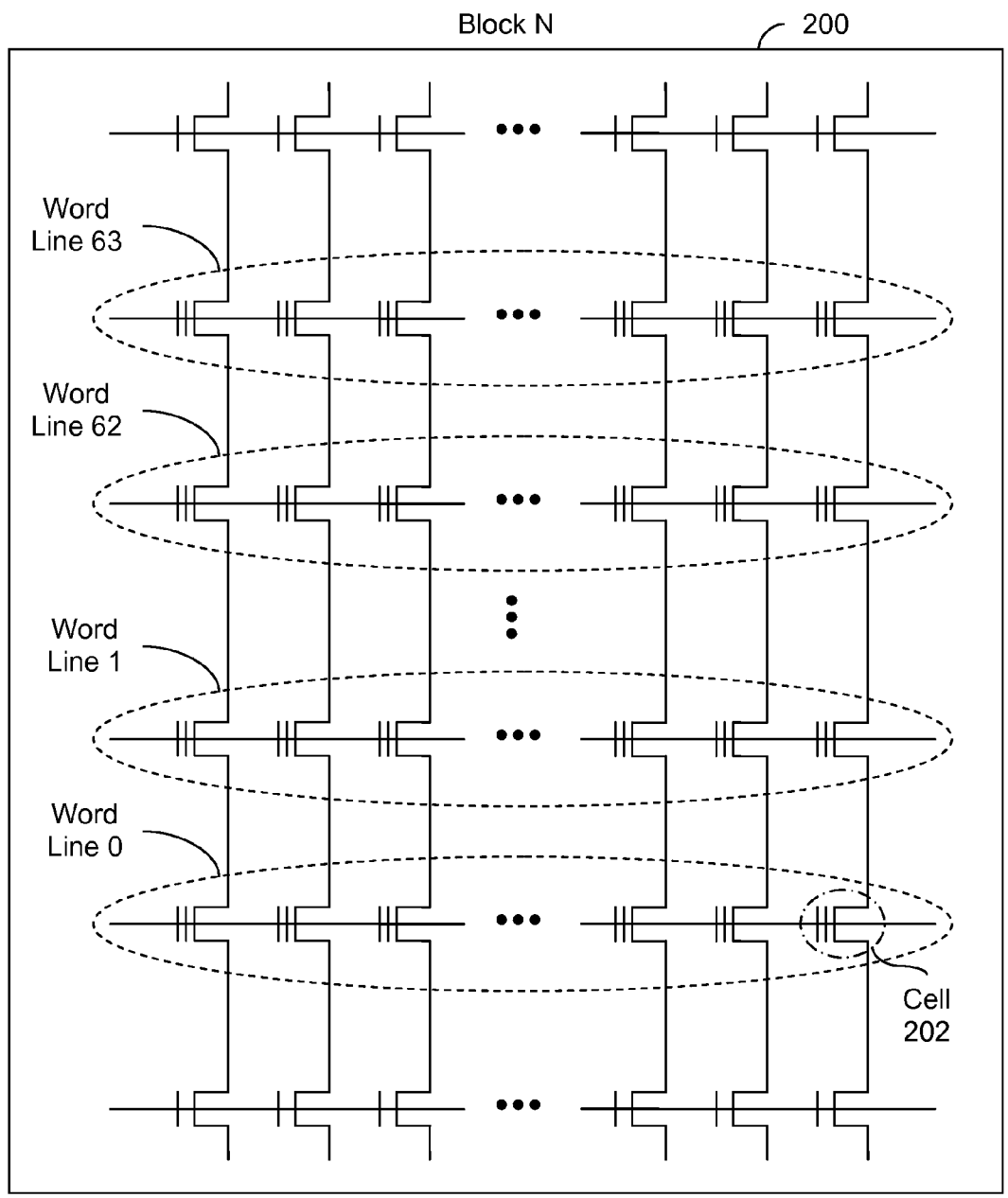
FIG. 2 is a diagram illustrating an embodiment of a block.

FIG. 2 is a diagram illustrating an embodiment of a block. A block is one example of a portion of a memory chip and there are a plurality of blocks in a given memory chip. For example, memory chip 102a of FIG. 1 includes multiple blocks. In the figure shown, block 200 includes 64 word lines arranged in rows. Each word line includes a plurality of cells, such as cell 202 in word line 0. In this example, cell 202 is a floating gate transistor. In various embodiments, a block includes any number of word lines and any number of cells.

Data is stored in a NAND flash system by programming a cell to a voltage threshold. In some embodiments, a cell stores a single bit of information (i.e., there are two possible stored voltage levels); this is referred to as single-level cell (SLC). In other embodiments, a cell is able to store multiple bits (i.e., there are more than two possible stored voltage levels) and this is called multi-level cell (MLC). Although some examples described herein show SLC/MLC or a certain number of bits, the techniques herein apply to any number of levels or bits.

When an erase operation is performed in a NAND flash system, the smallest unit the operation can be performed on is a block. For example, an erase cannot be performed only on cell 202 or only on word line 0—all of block 200 must be erased.

One issue with NAND flash memory is the finite number of program-erase cycles. Erasing stresses a cell because of the relatively large voltage differences that are applied to the floating gate and the memory well to remove electron charge by Fouler-Nordheim Tunneling (FN Tunneling). In the case of SLC, the number of program-erase cycles may be approximately 100,000 cycles. For MLC, the number of program-erase cycles may be approximately 10,000 cycles. The actual number of program-erase cycles (sometimes referred to as a lifetime) may vary from cell to cell but once that lifetime is reached for a cell, that cell fails. Typically, a cell fails in that it cannot be properly erased. In some embodiments, a memory chip notifies a controller if there is an issue performing an erase or other operation. If too many cells in a block fail, a controller may decide the block is no longer operational or otherwise capable of storing information. The exact number of cells that causes a block to be unusable may vary from configuration to configuration, but the basic principle holds.

The following figure shows an embodiment of a process to extend the lifetime of a block and/or mitigate capacity loss from cell failures.

Figure 3:
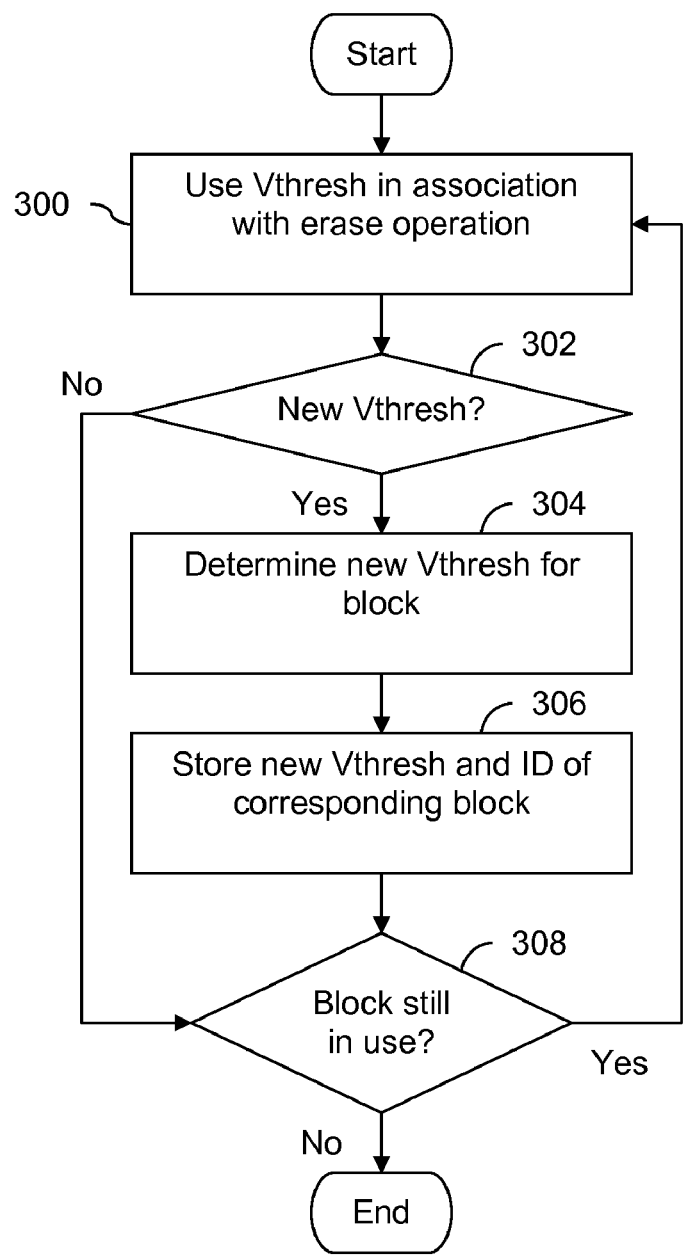
FIG. 3 is a flowchart illustrating an embodiment of a process that determines and stores a new voltage threshold.

FIG. 3 is a flowchart illustrating an embodiment of a process that determines and stores a new voltage threshold. In some embodiments, the process is performed by controller 100 of FIG. 1. In the example shown, the process operates on a block. In some embodiments, the process is repeated or otherwise performed on all blocks in a NAND flash memory system. The example process shown relates to an erase operation and other processes (such as reading or writing) are able to be performed but (for clarity) are not shown here.

At 300, a voltage threshold (Vthresh) is used in association with an erase operation. For example, after an erase operation, the erase is determined to be successful if the post-erasure voltage is less than the voltage threshold. In some embodiments, all blocks in a given memory chip use the same initial voltage threshold. At 302, it is determined whether to use a new voltage threshold. In some embodiments, a new Vthresh is used when one or more cells in a block can no longer be erased properly (e.g., indicated when the post-erasure voltage is greater than a voltage threshold). In such embodiments, the decision at 302 is based on whether an erase operation is successful. In some embodiments, some other criterion is used in making a decision at 302.

If it is determined to use a new voltage threshold at 302, a new Vthresh for a block is determined at 304. Since a block is the smallest unit in a NAND flash memory system that can be erased (at least in this example), the new Vthresh applies for the block the process is operating on. In some embodiments, one block uses one voltage threshold while another block uses another voltage threshold. In some embodiments, the new voltage threshold is strictly greater than a previous voltage threshold.

A new voltage threshold can be determined in a variety of ways. In some embodiments, a new voltage threshold is predetermined. In such cases, it would be known ahead of time what the possible new voltage thresholds are. In some embodiments, a new voltage threshold is determined dynamically or "on the fly" by (for example) measuring a voltage and determining a new voltage threshold based at least in part on that measured voltage. These are some examples of how a new voltage threshold is determined.

A new voltage threshold and ID of the corresponding block are stored at 306. In various embodiments, an ID of a block is any value that uniquely identifies a block, such as address or location. In one example, an ID is in the form: <memory chip><die><plane><block>. In some embodiments, an ID or address is in some other form. Returning to the example of FIG. 1, controller 100 stores the ID of the block and new voltage threshold in any appropriate location or format. This enables controller 100 to know which block uses which voltage threshold. In various embodiments, a block ID and/or voltage threshold is/are stored in a register, in a NAND and/or in a DRAM, etc. Controller 100 stores and/or retrieves this information as appropriate. In some embodiments, there is a default voltage threshold and only exceptions to this default are stored.

After storing information at 306 or if is determined not to use a new voltage threshold at 302, it is determined at 308 whether a block is in use. If so, the voltage threshold value used is associated with an erase operation at 300. In some cases, this may be a new voltage threshold determined and stored at steps 304 and 306.

In some embodiments, information stored at step 306 is retrieved by a controller prior to an access operation, such as reading or writing. For example, if N bytes of data are being written, a controller will need to know the capacity of a particular block in embodiments where adjusting the voltage threshold affects capacity. In some embodiments, a controller accesses the stored information prior to reading so that stored data can be properly read back. For example, the stored information may indicate the capacity and/or a maximum/minimum value that can be stored and the controller may need to know this in order for data to be read back properly.

The following figures show some more detailed examples of the above process. In some embodiments, a new voltage threshold is used when an erase operation is unsuccessful. In some embodiments, a new voltage threshold is used to avoid performing an erase operation. In some embodiments, lifetime can be extended at the expense of reduced storage capacity when a new voltage threshold is used. In some embodiments, storage capacity remains the same when a new voltage threshold is used. The following are merely examples and the technique can be performed in a variety of ways.

Figure 4:
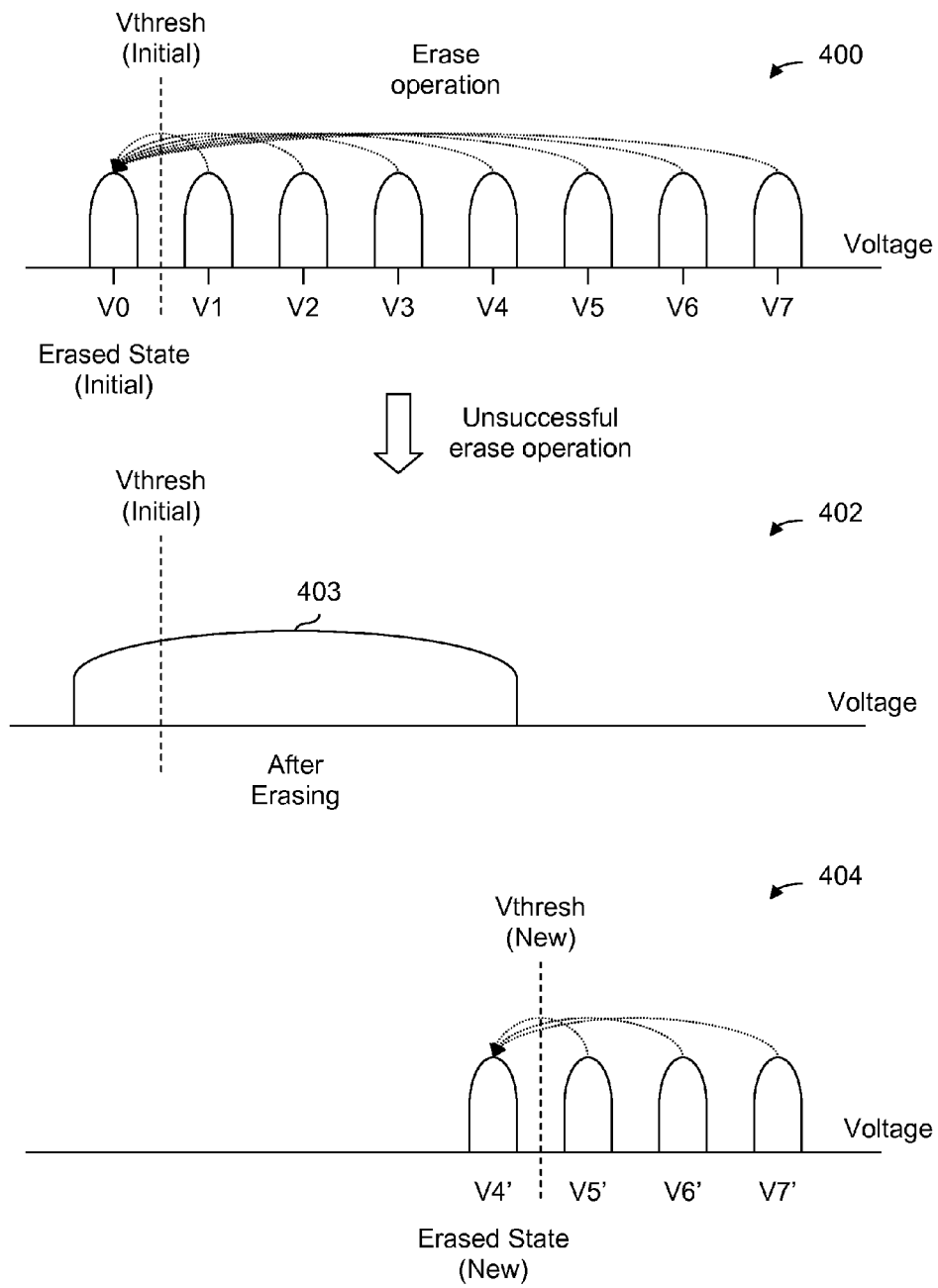
FIG. 4 is a diagram illustrating an embodiment in which a voltage threshold is increased after an unsuccessful erase operation.

FIG. 4 is a diagram illustrating an embodiment in which a voltage threshold is increased after an unsuccessful erase operation. In this example, an MLC example is shown. In diagram 400, eight possible voltage values (V0 thru V7) can be stored and read back, corresponding to three bits of storage.

During an erase operation, a voltage differential is applied across each cell. The initial voltage threshold in diagram 400 is between the voltages V0 and V1 and V0 corresponds to an erased state. If a value of V1, V2, . . . , or V7 is stored by a cell, the voltage returns to V0 in a successful erase. In systems described herein, the lowest level that erasures are capable of being performed at is the block level. In some other systems, erasures can be performed at some other level (e.g., smaller portions); the techniques described herein are still applicable.

A voltage threshold is used to test or determine whether an erase operation has been performed successfully. In the example of diagram 400, the initial voltage threshold is between V0 and V1 (e.g., the midpoint). The post-erasure voltage of each cell is compared to a voltage threshold. If it is below the voltage threshold, then the erase operation is successful for that cell. Diagram 402 shows an unsuccessful erase operation because some (in other embodiments, all) of the post-erasure voltage (403) is greater than the threshold voltage. In some embodiments, an unsuccessful erase operation is declared after multiple erase-test cycles have been performed.

In this example, the new voltage threshold is increased after an unsuccessful erase operation. Diagram 404 shows a new (increased) voltage threshold between V4' and V5' and new voltage values (V4'-V7') that can be used to store information. In various embodiments, the new voltage threshold is pre-determined (e.g., before the unsuccessful erase operation in diagram 402) or is determined on the fly (e.g., by measuring post-erasure voltage 403 and calculating a new voltage threshold using the measurement of voltage 403). The new voltage threshold is greater than the initial voltage threshold and V4' corresponds to the new erased state. In some embodiments, V4' is the same level as post-erasure voltage 403. In some embodiments, V4=V4', V5=V5', V6=V6', and V7=V7'. In some embodiments, V4!=V4', V5!=V5', V6!=V6', and/or V7!=V7'.

In some embodiments, multiple cells in a given block must have a problem being erased before a new voltage threshold is used. For example, some NAND flash memory systems are capable of handling some number of cell failures in a single block. More generally, if a cell is referred to as a sub-portion and a block is referred to as a portion, it is determined (at least in this embodiment) to use a new voltage threshold if N sub-portions within a given portion are unsuccessfully erased. For example, a voltage threshold is not changed unless 5 or more cells cannot be properly erased in that block.

As shown in this example, with the new voltage threshold, the capacity has decreased from 8 values (i.e., 3 bits) to 4 values (i.e., 2 bits). In this example, the entire block uses the same voltage threshold, so all cells in the block are reduced from 3 bit capacity to 2 bit capacity. However, other systems that do not use a new voltage threshold would declare the entire block unusable, so some capacity has been retained. In some other embodiments, some other portion (e.g., besides a block) uses the same voltage threshold. This may, for example, depend upon the structure of a particular NAND flash system.

In some cases, more than one cell in a given block cannot be erased properly. In some embodiments, a new voltage threshold in such cases is determined based on the largest or highest post-erasure voltage of the unsuccessfully erased cells. For example, if one cell can only be erased down to 3 V and another cell can only be erased down to 5 V, the new voltage threshold is selected (e.g., from pre-defined levels) or otherwise determined (e.g., on the fly) based on the 5 V value.

In some embodiments, the process repeats if further erase operations are unsuccessful. For example, the process may be repeated where a third voltage threshold is used and two possible voltage levels are stored (i.e., 1 bit capacity).

In this figure and other figures, a dome shape is used to indicate voltage variations (e.g., due to noise). In a real-world device, a cell will not perfectly store a voltage. For example, suppose two cells are instructed to store a voltage of 0 V. One cell may store a value of 0.1 V and the other cell may store a value of −0.1 V. Or, a given cell in one instance may store a value of 0.1 V and during a later instance may store a value of −0.1 V. A wider dome shape is used to indicate greater variation and/or greater noise. A perfect device capable of perfectly storing a given voltage would represented by a straight, vertical line.

In some embodiments, another parameter in addition to the voltage threshold is changed. The following figures describe some embodiments in which a sub-range is also changed when the voltage threshold is changed.

Figure 5:
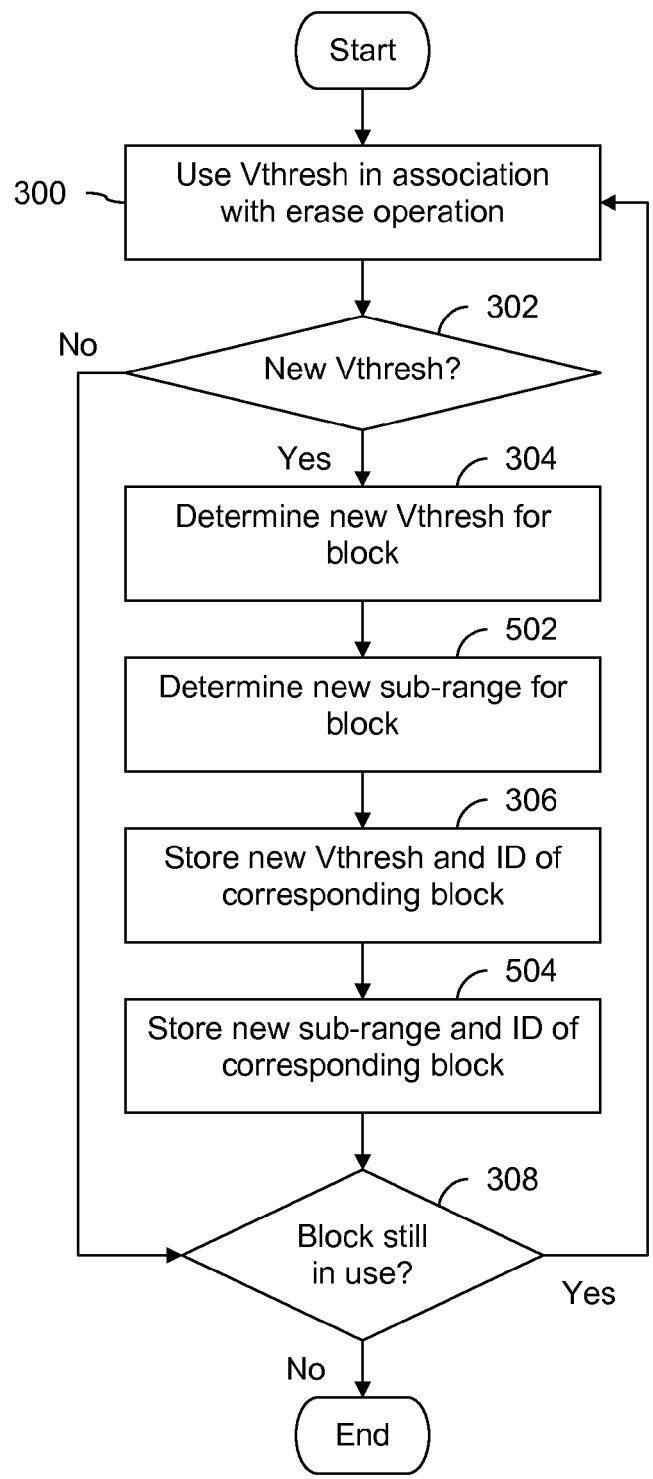
FIG. 5 is a flowchart illustrating an embodiment of a process that determines and stores a new voltage threshold and a new sub-range as appropriate.

FIG. 5 is a flowchart illustrating an embodiment of a process that determines and stores a new voltage threshold and a new sub-range as appropriate. In the example shown, the process is similar to that shown in FIG. 3 and the same reference numbers are used to indicate corresponding steps.

A voltage threshold (Vthresh) is used in association with an erase operation at 300. At 302, it is determined whether to use a new voltage threshold. As described in FIG. 3, various decisions or events can cause this to occur in various embodiments. In some embodiments, one or more unsuccessful erase operations cause a new voltage threshold to be used. In some embodiments, it is determined to use a new voltage threshold to avoid performing an erase operation.

In this example, if it is determined to use a new voltage threshold at 302, a new voltage threshold for a block is determined at 304 and the new voltage threshold and ID of corresponding block are stored at 306. In addition, a new sub-range is determined for the block at 502 and the new sub-range and ID of the corresponding block are stored at 504. At 308 it is determined whether a block is still in use. If so, the (new) voltage threshold is used at 300.

In some embodiments, information associated with a sub-range is stored with or in the same location as the voltage threshold. Alternatively, in some embodiments, sub-range information is not stored. For example, a page (or other portion of a NAND flash memory system) can be read out and a sub-range is determined dynamically based on an average read value of all cells in the page. In such embodiments, a system is configured to read (and determine a sub-range) before programming or changing the state to a next sub-range. For example, if there are N pre-defined sub-ranges, in such embodiments the system would read a page, determine which of the N pre-defined sub-ranges is being used and update the system as necessary to operate in the next sub-range state.

The following figure shows one example of using a new voltage threshold and sub-range in the event one or more erase operations are unsuccessful.

Figure 6:
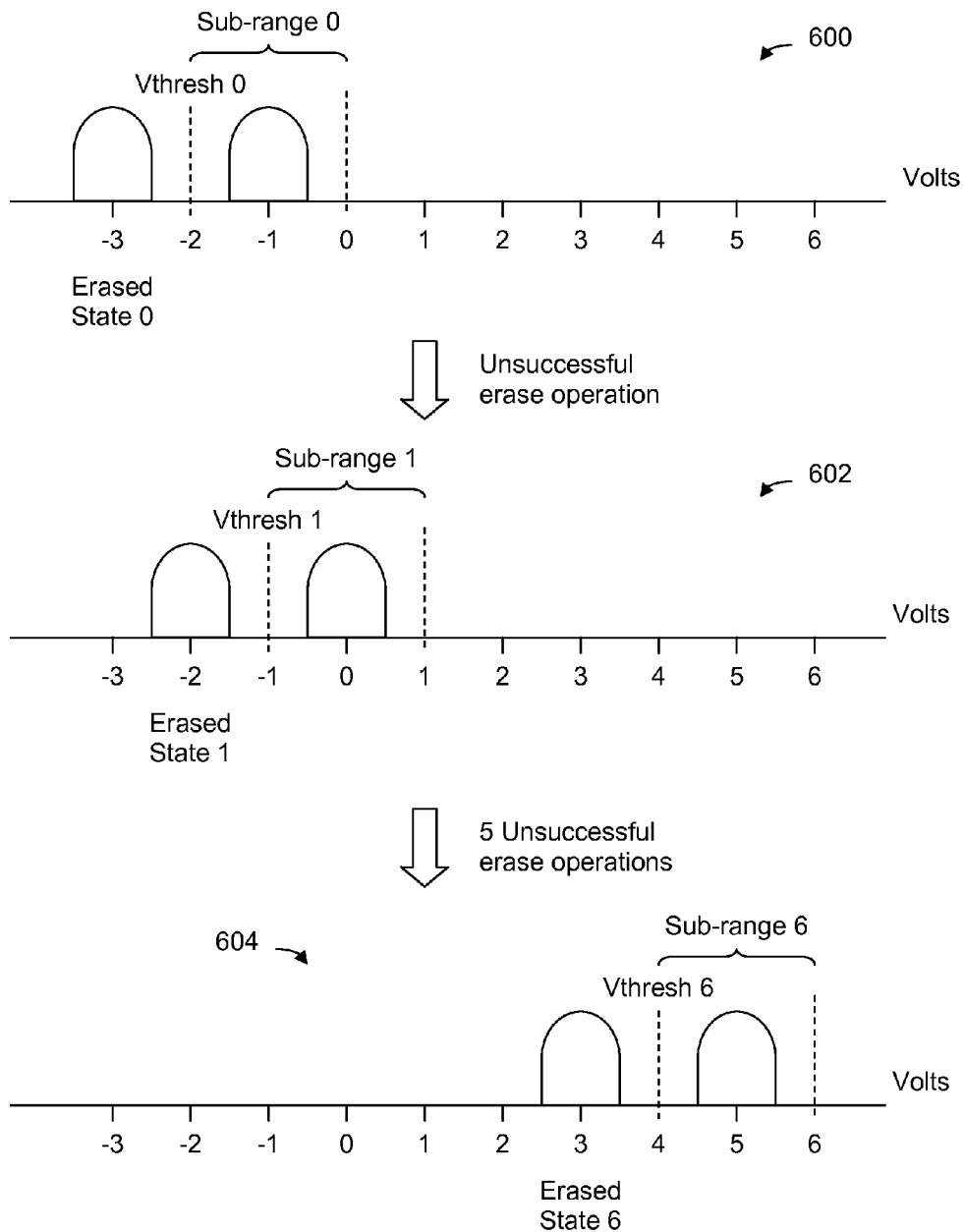
FIG. 6 is a diagram illustrating an embodiment in which a voltage threshold and sub-range are increased after an unsuccessful erase operation.

FIG. 6 is a diagram illustrating an embodiment in which a voltage threshold and sub-range are increased after an unsuccessful erase operation. In this figure, a SLC example is shown. In some embodiments, the technique is applied to a MLC system. In the example shown, seven voltage thresholds and seven corresponding sub-ranges are predefined. Diagram 600 shows an initial state. In this initial state, an initial voltage threshold (Vthresh 0) of −2 V is used and an initial sub-range (sub-range 0) of (−2 V, 0 V) is used. In this example, a sub-range extends from a voltage threshold to some voltage ceiling. In some embodiments, a sub-range is defined differently (e.g., (−4 V, 0 V) in the case of diagram 600).

In the event an unsuccessful erase operation occurs, the system transitions from the state shown in diagram 600 to the state shown in diagram 602. In some embodiments, multiple cells in a given block must have problems being erased before a state change from diagram 600 to 602 occurs. In diagram 602, a second voltage threshold (Vthresh 1) of −1 V is used and a second sub-range (sub-range 1) of (−1 V, 1 V) is used. Vthresh 1=−1 V is acceptable in this example since the voltage after the unsuccessful erase operation (not shown) is sufficiently low enough to be read back as an erased state when compared to a voltage threshold of −1 V. For example, a post-erasure voltage of −1.9 V works for a threshold voltage of −1 V. In some embodiments, if the post-erasure voltage is too high, a higher voltage threshold and corresponding sub-range are used.

After 5 more unsuccessful erase operations occur, the system is in the state shown in diagram 604. In this state, the voltage threshold (Vthresh 6) is equal to 4 V and the sub-range (sub-range 6) is from 4 V to 6 V.

As shown in this example, the capacity remains the same as the system progresses through the states shown in diagrams 600, 602, and 604. Each of the states shown has a 1 bit storage capacity. In contrast, in FIG. 5 the entire storage capacity is used initially and capacity decreases with each state. In some applications, having a constant capacity is attractive since it simplifies the responsibilities of a controller (e.g., the controller does not need to determine how much capacity is currently available in a certain region and correspondingly how or where to store information).

One advantage of the technique shown in this figure is an increased lifetime. The voltage difference applied across the cells is smaller than if the entire range were used initially (e.g., from −2 or −3 V to 5 V). For example, suppose V0-V7 in FIG. 4 correspond to −2 V, −1 V, . . . , 5 V. In that example, the system may have to swing from 5 V (the highest possible stored value) to −2 V (the erased state). In contrast, when using the initial sub-range shown in diagram 600, the voltage ranges from −3 V to −1 V (i.e., the voltage swing or difference is smaller). Less charge needs to tunnel in during a program operation and tunnel out during an erase operation. As a result, less charge is trapped in the floating gate (a common cause of erase related failures).

Another benefit is the program time and erase time are reduced. With a smaller gap between the erase level and programmed levels, the program and erase time are reduced because less electron charge are injected to and removed from the floating gate. In applications where the write bandwidth requirement is high, a reduced program and/or erase time is desirable.

Figure 7:
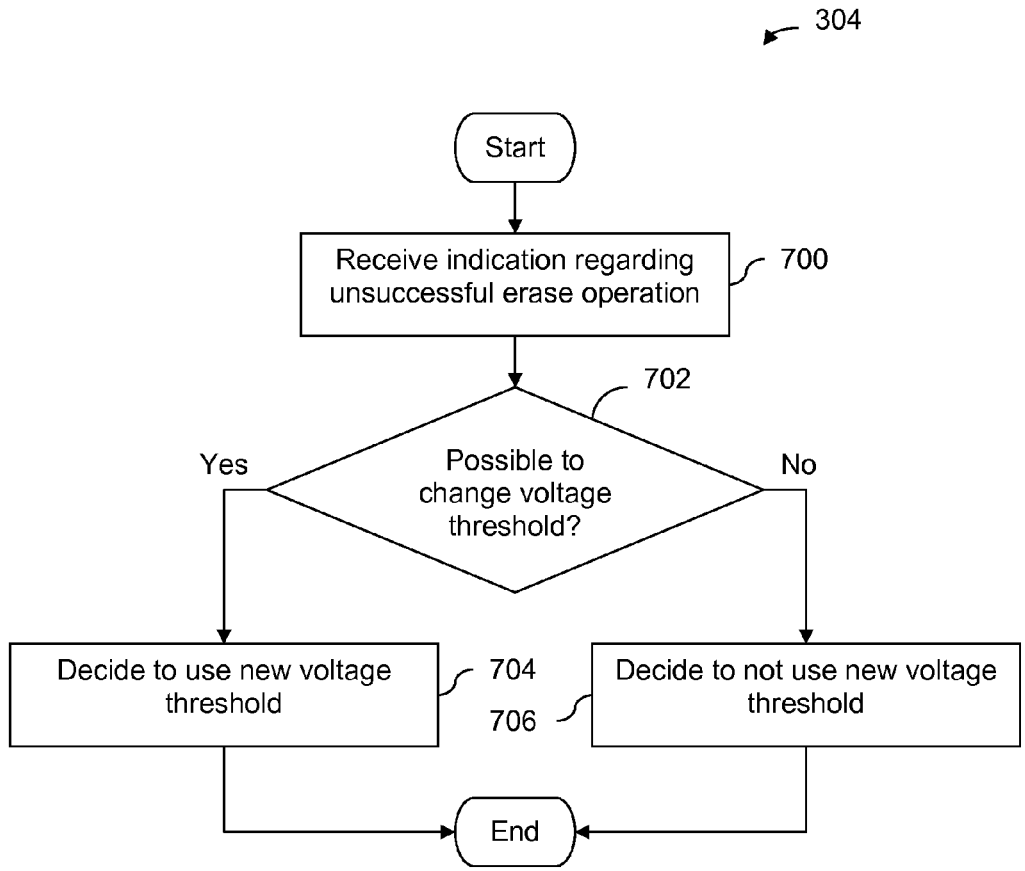
FIG. 7 is a flowchart illustrating an embodiment of a process for determining whether to use a new voltage threshold in the event an unsuccessful erase operation occurs.

FIG. 7 is a flowchart illustrating an embodiment of a process for determining whether to use a new voltage threshold in the event an unsuccessful erase operation occurs. In some embodiments, step 304 of FIG. 3 is implemented as shown. In some other embodiments, some other decision process is used.

In the example shown, an indication regarding an unsuccessful erase operation is received at 700. For example, a memory chip may report an erase operation was unsuccessful. At 702, it is determined whether it is possible to change a voltage threshold. For example, if the system is in the state shown in diagram 604 of FIG. 6, it is not possible to increase the voltage threshold further. If the system is in the state shown in diagrams 600 or 602, it is possible to increase the voltage threshold. In some embodiments, this decision is based on a post-erasure voltage and/or a maximum voltage at which a memory device is able to operate at. If it is possible, it is decided to use a new voltage threshold at 704. Otherwise, it is decided to not use a new voltage threshold at 706.

Figure 8:
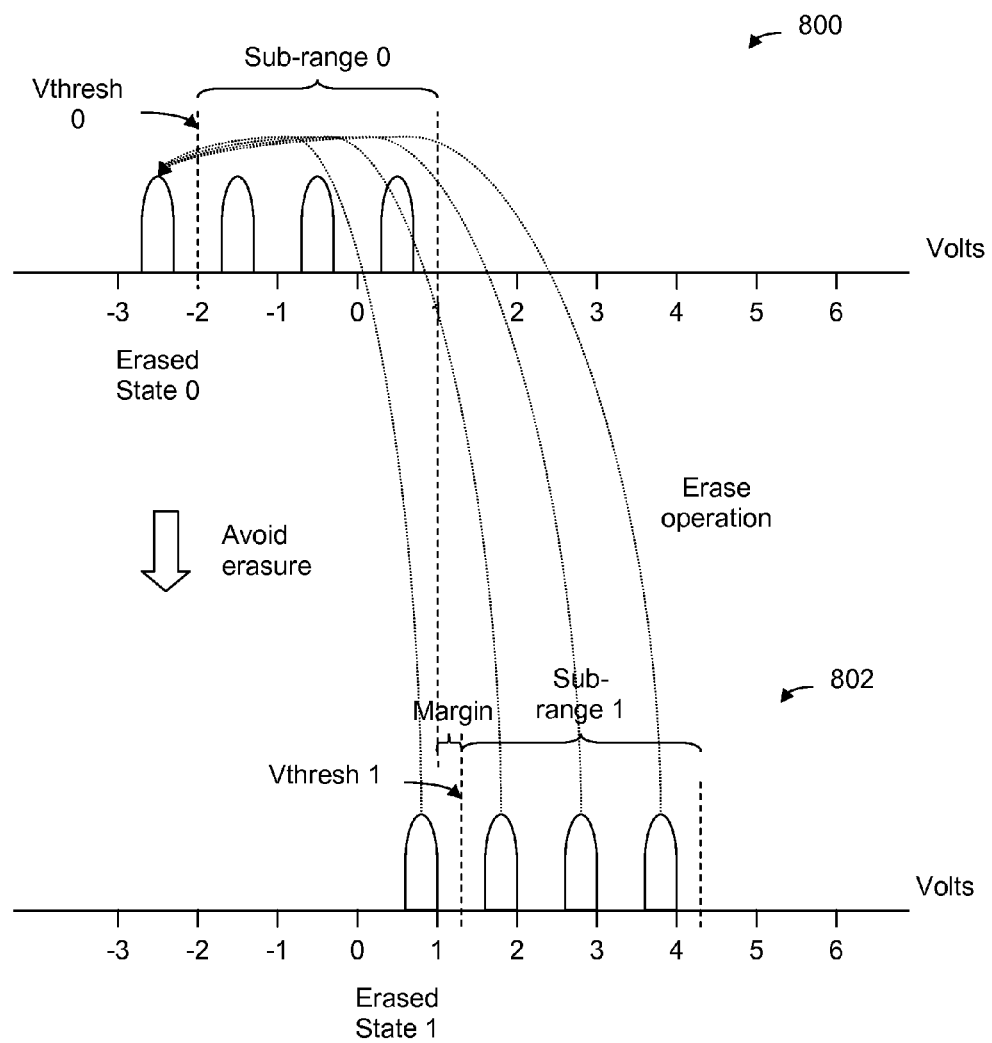
FIG. 8 is a diagram showing an embodiment of a MLC system in which a voltage threshold and sub-range are changed to avoid performing an erase operation.

FIG. 8 is a diagram showing an embodiment of a MLC system in which a voltage threshold and sub-range are changed to avoid performing an erase operation. In the example shown, diagram 800 shows an initial sub-range (sub-range 0) of (−2 V, 1 V) and initial voltage threshold (Vthresh 0) of −2 V. In this figure, a 2-bit MLC example is shown and 4 possible voltages can be stored.

In this example, when an erase operation is desired, the system is configured to change the voltage threshold from −2 V to a value between 2 V and 1 V and change the sub-range from (−2 V, 1 V) to (1.X V to 4.X V) where 1.X V indicates a value between 1 V and 2 V. Diagram 802 shows the new voltage threshold and new sub-range. The new voltage threshold is sufficiently large so that all of the possible programmed values in diagram 800 are perceived as being in an erased state when compared to the new voltage threshold (Vthresh 1) in diagram 802. The device is perceived as being erased without having to stress the device by tunneling out charge.

In this particular example, a program step is not required when the sub-range and voltage threshold are changed from the state shown in diagram 800 to that shown in diagram 802. Alternatively, in some embodiments, a program operation is performed when changing from the state shown in diagram 800 to the state shown in diagram 802 (e.g., so that after the program step, erased state 1 is stored). In such embodiments, the voltage is a known value (e.g., erased state 1) and not an unknown state (e.g., any one of the 4 possible voltages shown in diagram 800).

Once in the state shown in diagram 802, the next time an erase operation is desired, the erase operation is performed and the system changes from the state shown in diagram 802 to that shown in diagram 800. The stored value reverts to erased state 0 of diagram 800.

In this particular example, there is some margin between the maximum voltage (i.e., the upper limit of sub-range 0) in diagram 800 and the voltage threshold (Vthresh 1) in diagram 802. Although not shown in some other figures, in some embodiments, margin is included in determining a new voltage threshold and/or sub-range.

In the example shown, an erase operation is performed once for every two desired erase operations. When in the state shown in diagram 800, an erase is avoided by changing to the state shown in diagram 802. When in the state shown in diagram 802, an erase is performed if it is desired. By performing fewer erase operations the effective lifetime of a NAND flash memory system can be extended. In this particular example, the lifetime would be extended (at least) 2× since half of the desired erase operations are performed.

In some embodiments, a desired erase operation is indicated by an interrupt, message, or other indication from an upper layer application, host, or other entity. For example, if a desired erase operation comes from a host in the form of an erase instruction, in this example for every 2 erase instructions received from the host, 1 erase instruction is passed to a NAND I/O bus and/or NAND flash memory chips. In some embodiments, a controller manages the memory space and determines when an erase is desired.

The following figure shows another example in which erase operations are avoided. In the following figure, an SLC example is shown.

Figure 9:
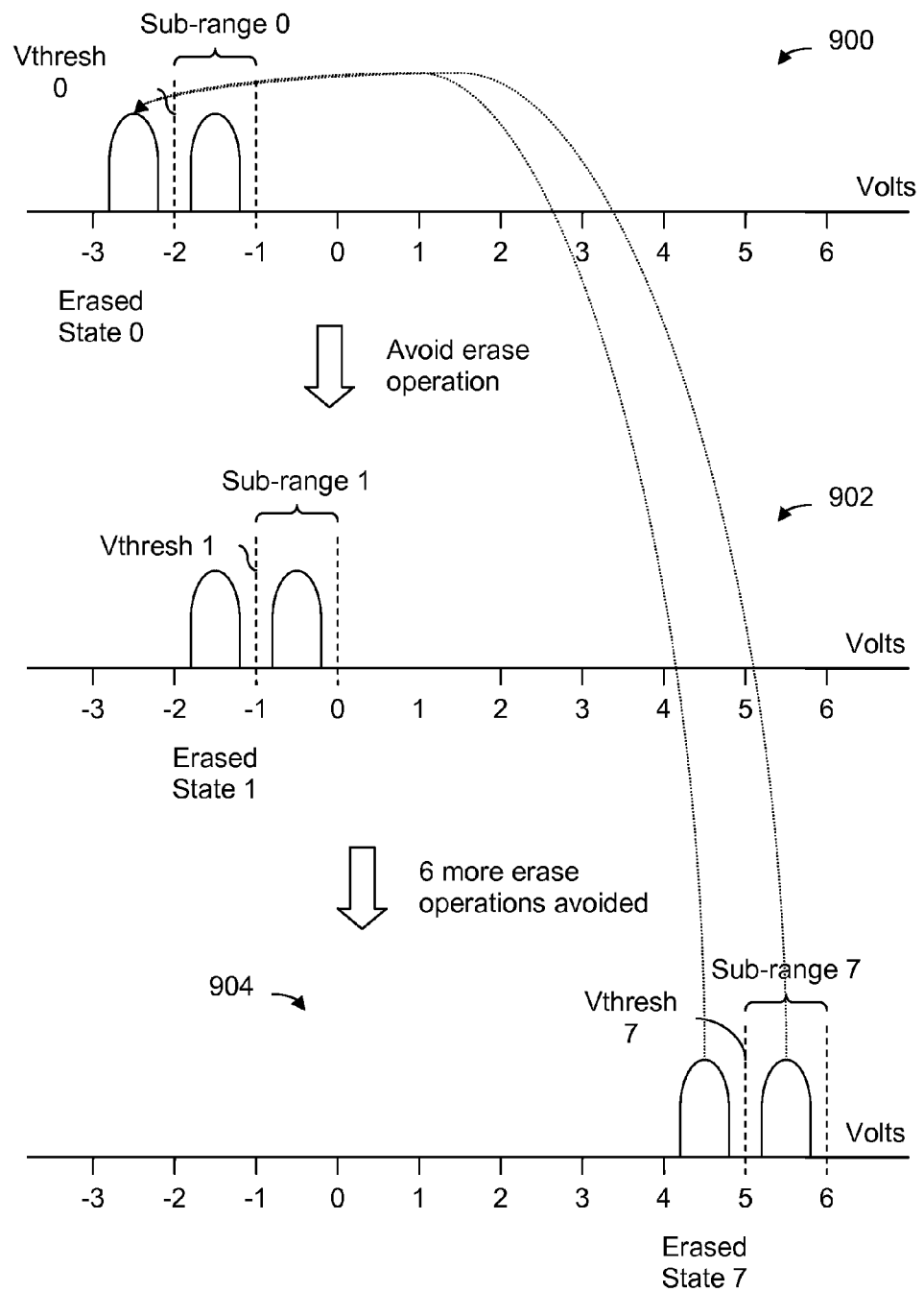
FIG. 9 is a diagram showing an embodiment of an SLC system in which erase operations are avoided by changing a voltage threshold and a sub-range.

FIG. 9 is a diagram showing an embodiment of an SLC system in which erase operations are avoided by changing a voltage threshold and a sub-range. In the example shown, the system begins in the state shown in diagram 900. In that example, the voltage threshold (Vthresh 0) is −2 V and the sub-range (sub-range 0) is (−2 V, −1 V).

If an erase operation is desired, the system changes from the state shown in diagram 900 to that shown in diagram 902. The new voltage threshold (Vthresh 1) is −1 V and the new sub-range (sub-range 1) is (−1 V, 0 V). In this example, no margin is used and the new voltage threshold (Vthresh 1) equals the previous voltage maximum (−1 V). In some other embodiments, margin is used.

In some embodiments, a program operation is performed when transitioning from the state shown in diagram 900 to the state shown in diagram 902 so the voltage is at a known or consistent value (e.g., erased state 1). In some other embodiments, no program operation is performed when transitioning and whatever value was stored (e.g., a value between −3 V and −2 V or a value between −2 V and −1 V) is kept.

After avoiding 6 more erase operations by transitioning through 6 corresponding voltage threshold and sub-ranges, the system enters the state shown in diagram 904. In this state, the voltage threshold (Vthresh 7) is 5 V and the sub-range (sub-range 7) is (5 V, 6 V). In the event an erase is desired in this state, an erase operation is performed and the stored values (i.e., 4.X V or 5.X V) revert to erased state 0 of diagram 900. The system then transitions to diagram 900 and the corresponding voltage threshold and sub-range.

In this example, 1 out of every 8 desired erase operations is performed. This increases the lifetime of a NAND flash memory system by at least 8× since fewer erasures are performed, causing less stress on the system due to erasing.

Figure 10:
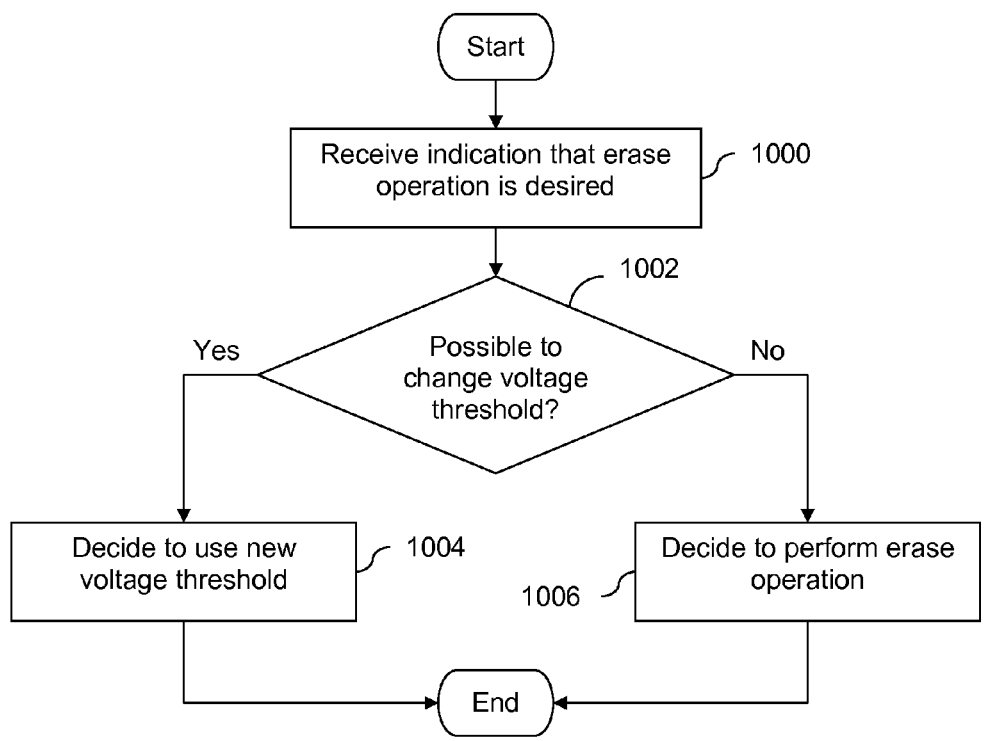
FIG. 10 is a flowchart illustrating an embodiment of a process for determining whether to use a new voltage threshold in the event an erase operation is desired.

FIG. 10 is a flowchart illustrating an embodiment of a process for determining whether to use a new voltage threshold in the event an erase operation is desired. In some embodiments, step 304 of FIG. 3 is implemented as shown. In some other embodiments, some other decision process is used.

In the example shown, an indication that an erase operation is desired is received at 1000. For example, it may be desired to store some other data at a given location or it may no longer be necessary to store some data. At 1002, it is determined whether it is possible to change a voltage threshold. For example, when transitioning from the state shown in diagram 900 to that shown in diagram 902 of FIG. 9, it is possible change the voltage threshold because there are available, higher voltage thresholds the system can switch to. However, in the case of diagram 904 of FIG. 9, it is not possible to change the voltage threshold. If it is possible, it is decided to use a new voltage threshold at 1004. Otherwise, it is decided to not use a new voltage threshold at 1006.

In some embodiments, a voltage threshold is changed to accommodate additional noise in a system. The following figures show some examples.

Figure 11:
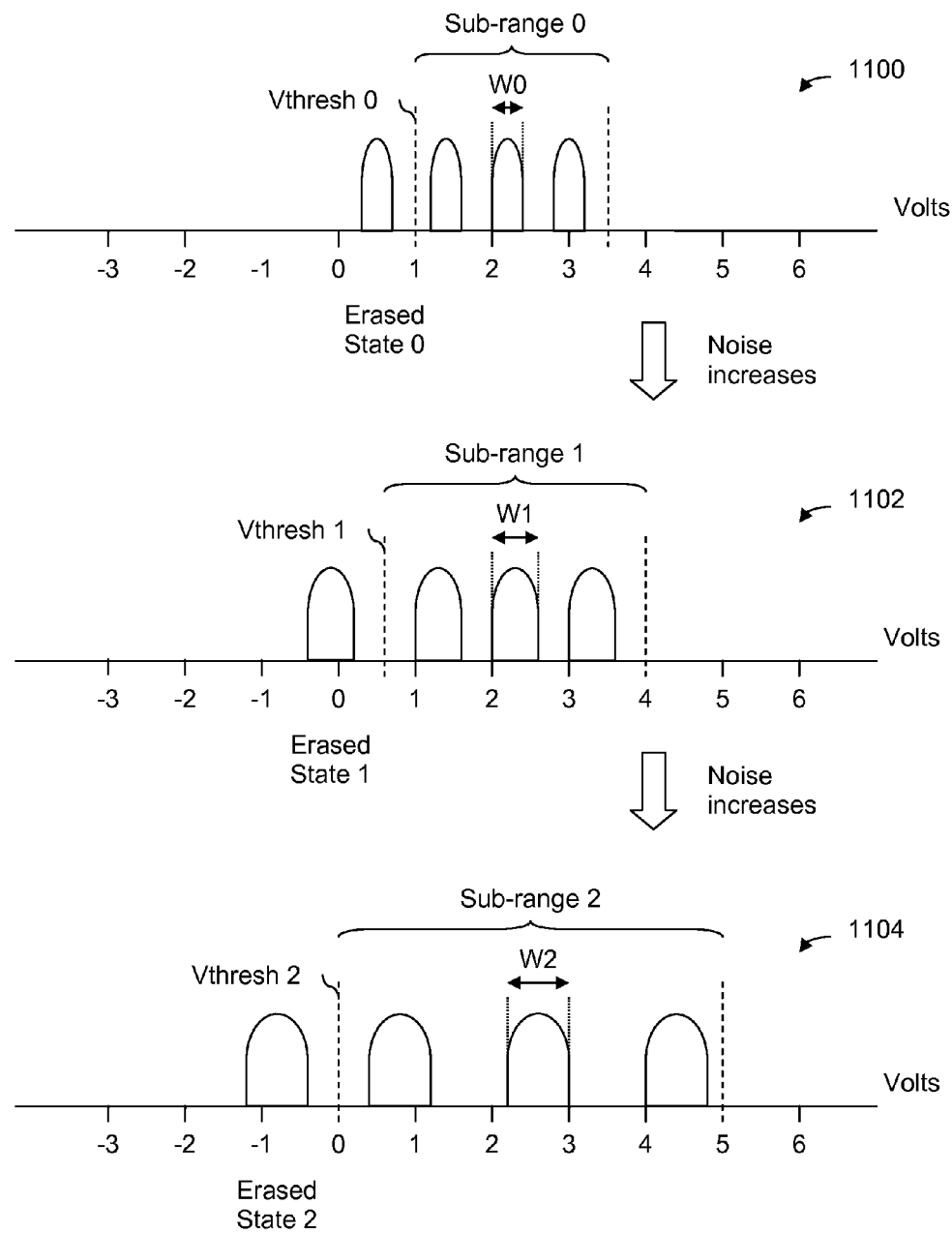
FIG. 11 is a diagram showing an embodiment of a MLC system that changes a voltage threshold and sub-range in response to increased noise in the system.

FIG. 11 is a diagram showing an embodiment of a MLC system that changes a voltage threshold and sub-range in response to increased noise in the system. In the example shown, noise increases in the system over time so that the (stored) voltage varies more and more over time from an ideal voltage. The increased noise over time is reflected in the widths of the stored voltages. The width W0 of diagram 1100 is strictly less than W1 of diagram 1102 which in turn is strictly less than W2 of diagram 1104.

In diagram 1100, the voltage threshold (Vthresh 0) is 1 V and the sub-range (sub-range 0) is (1 V, 3.X V), where 3.X V is a voltage between 3 V and 4 V. In diagram 1102, the noise has increased and the system has changed to the state shown in diagram 1102. In this state, the voltage threshold (Vthresh 1) is 0.X V (a voltage between 0 V and 1 V) and the sub-range (sub-range 1) is (0.X V, 4 V). The noise increases even more and the system changes to the state shown in diagram 1104. The voltage threshold (Vthresh 2) is now 0 V and the sub-range (sub-range 2) is (0 V, 5 V).

In various embodiments, various techniques are used to determine when to change a voltage threshold and/or sub-range based on noise. In some embodiments, the widths W0, W1, and W2 reflect or are otherwise related to a standard deviation, variance, or some other noise parameter. In some embodiments, a standard deviation or other parameter is measured by programming known values, reading back the programmed values, and calculating a noise parameter (e.g., standard deviation or variance) based on the read values. In some embodiments, if a noise parameter is greater than a threshold, the voltage threshold and/or sub-range are changed.

Figure 12:
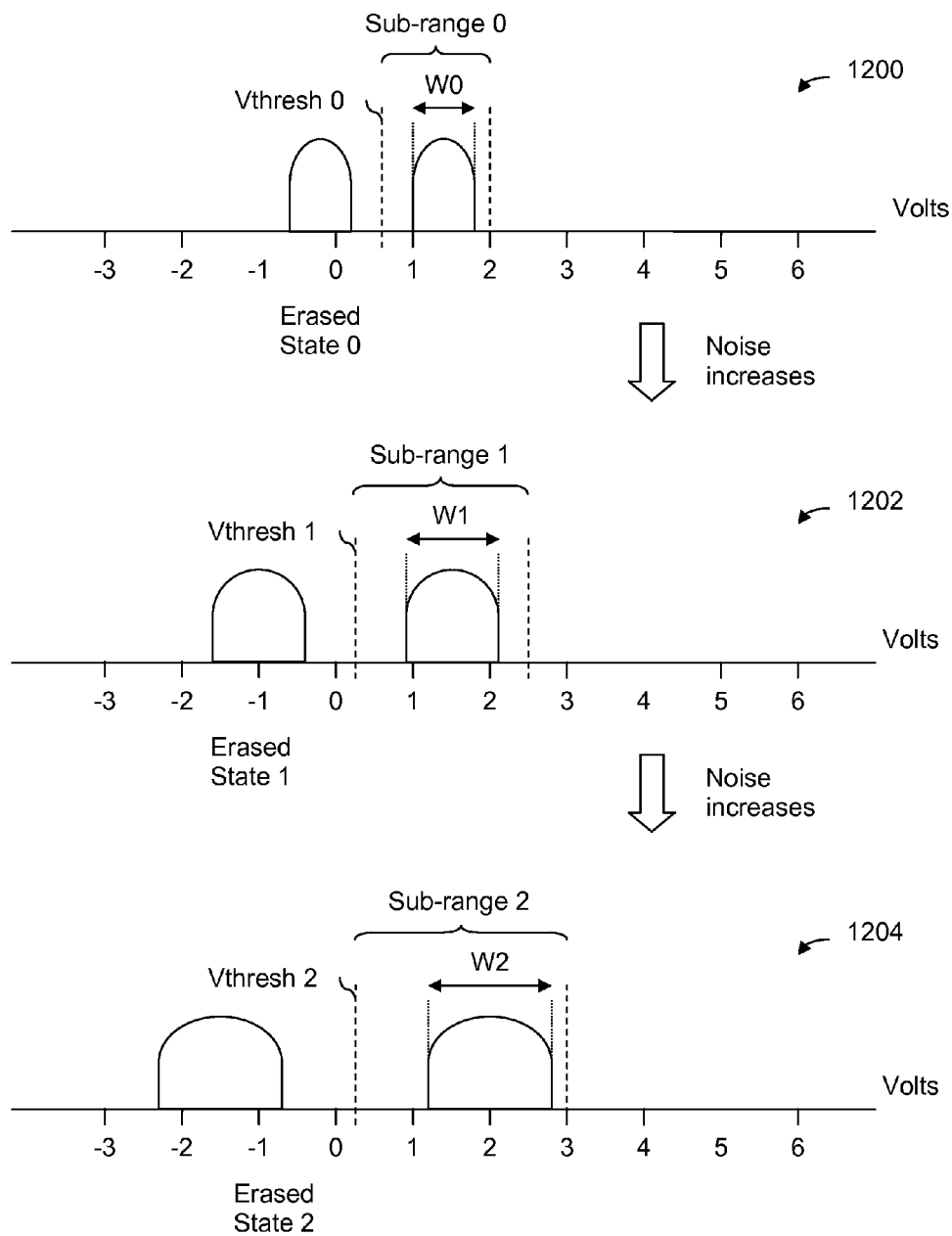
FIG. 12 is a diagram showing an embodiment of an SLC system in which a voltage threshold and sub-range are changed as noise increases.

FIG. 12 is a diagram showing an embodiment of an SLC system in which a voltage threshold and sub-range are changed as noise increases. In the example shown, the system begins in the state shown in diagram 1200. The voltage threshold (Vthresh 0) is between 0 V and 1 V and the sub-range (sub-range 0) is (0.X V, 2 V). In diagram 1200, the noise corresponds to a width of W0. Over time, the noise increases and W1>W0. To deal with the additional noise, the system changes to the state shown in diagram 1202 with a voltage threshold (Vthresh 1) between 0 V and 1 V and a sub-range (sub-range 1) of (0.X V, 2.X V). The noise increases further from W1 to W2. The system again changes the sub-range and voltage threshold and changes to the state shown in diagram 1204. In diagram 1204, a voltage threshold (Vthresh 2) of 0.X V (a value between 0 V and 1 V) and a sub-range (sub-range 2) of (0.X V, 3 V) are used.

As shown in the FIGS. 11 and 12, in some embodiments, a voltage threshold decreases in value. Similarly, a sub-range (if used) can be adjusted in a variety of ways in various embodiments.

Figure 13:
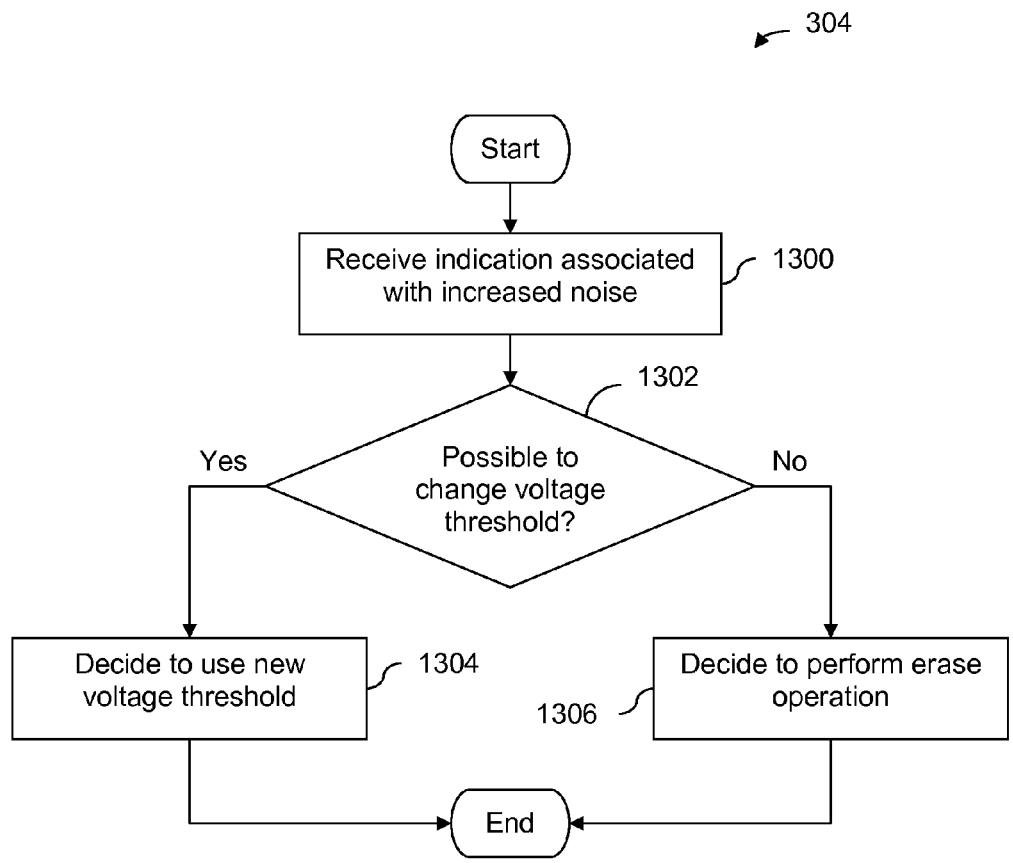
FIG. 13 is a flowchart illustrating an embodiment of a process for determining whether to use a new voltage threshold in response to increased noise.

FIG. 13 is a flowchart illustrating an embodiment of a process for determining whether to use a new voltage threshold in response to increased noise. In some embodiments, step 304 of FIG. 3 is implemented as shown. In some other embodiments, some other decision process is used.

In the example shown, an indication associated with increased noise is received at 1300. In some embodiments, a process monitors or otherwise measures a noise parameter in a system. For example, standard deviation or variance may be maintained and updated with values that are read back as part of the normal operation of a device. In the event the variance or other noise parameter exceeds some threshold, a notification may be sent. At 1302, it is determined whether it is possible to change a voltage threshold. If it is possible, it is decided to use a new voltage threshold at 1304. Otherwise, it is decided to not use a new voltage threshold at 1306.

In some embodiments, memory chips have various settings, parameters, or controls that can be set by a controller to adjust a voltage threshold and/or sub-range. The following figure shows one example system configuration in which a voltage threshold and/or a sub-range is able to be adjusted as desired. In some embodiments, a system is configured differently than the example shown below.

Figure 14:
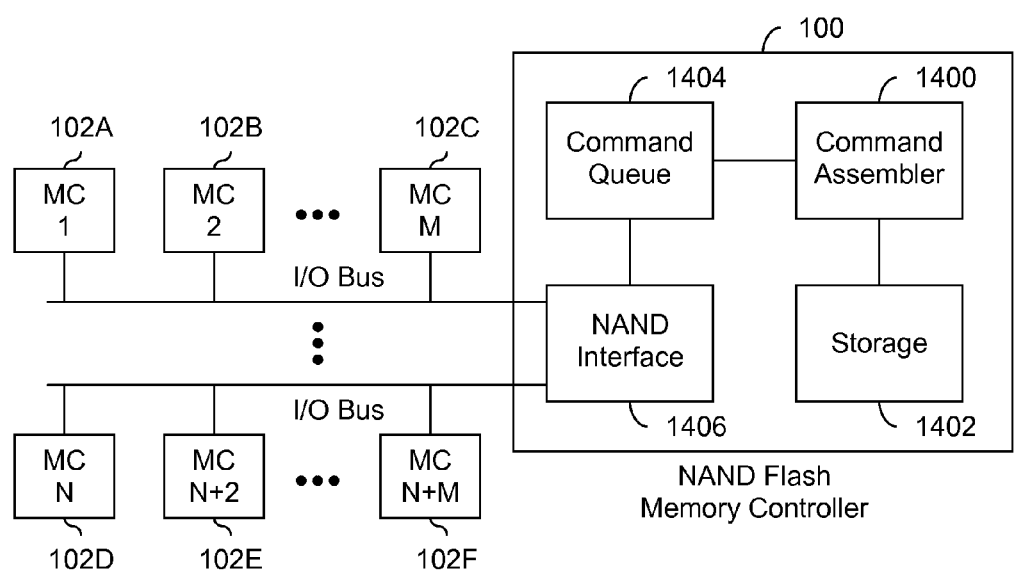
FIG. 14 is a diagram showing an embodiment of a NAND flash memory system with memory chips that are able to be set by a controller.

FIG. 14 is a diagram showing an embodiment of a NAND flash memory system with memory chips that are able to be set by a controller. In the example shown, a more detailed example of the system from FIG. 1 is shown. Controller 100 includes command assembler 1400, storage 1402, command queue 1404, and NAND interface 1406.

In this example, storage 1402 is used to stored information associated with voltage thresholds, sub-ranges (if used), and corresponding identifiers (e.g., identifying the block or memory chip a particular voltage threshold corresponds to). Storage 1402 is implemented in various embodiments using a variety of tables, formats, lists, databases, NAND flash itself, or other data structures.

Command assembler 1400 is responsible for assembling commands. This includes sending commands to command queue 1404 in a proper order or sequence. Command assembler 1400 accesses information stored in storage 1402 to assemble a command. For example, one block may have a different voltage threshold than another block and this may require setting a particular register or control to a proper value.

Commands are put into command queue 1404 by command assembler 1400. NAND interface 1406 retrieves commands (in order) from command queue 1404 and parses them as appropriate and sends the output over the I/O bus to the memory chip(s). In some embodiments, multiple memory chip(s) receive a given command and the target memory chip executes the command and the other memory chips ignore the command.

The particular parameter or control being set and/or the structure or format of an assembled command may vary from embodiment to embodiment, for example depending upon the particular memory chip used. In some embodiments, commands put into command queue 1404 are generic and are not chip-specific. In some embodiments, NAND interface 1406 translates or parses the generic commands as necessary into the particular format or structure used by the memory chip. For example, one manufacturer may have commands in one format and another manufacturer may have commands in another format. Or, the location or address of a particular control or parameter may vary from chip to chip. In some cases, one type of memory chip has (sub) portions of a different size compared to another memory chip. For example, the size of a memory chip may be ~2000 blocks for one memory chip and ~4000 blocks for another memory chip. In some embodiments, one type of memory chip has a different handshaking than another type of memory chip.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
   an interface on a NAND Flash memory controller configured to perform an erase operation on a NAND Flash memory chip including to a first cell on the NAND Flash memory chip, wherein:
      the first cell is configured to store a first number of bits;
      the NAND Flash memory chip further includes a second cell which is configured to store the first number of bits; and
      the first cell and the second cell are in a same block on the NAND Flash memory chip; and
   a processor on the NAND Flash memory controller configured to:
      determine whether the erase operation performed on the NAND Flash memory chip is successful, including by determining whether (1) the first cell and the second cell are both successfully erased, (2) one of the first cell and the second cell is successfully erased and the other one is unsuccessfully erased or (3) the first cell and the second cell are both unsuccessfully erased, wherein:
         in the event it is determined that (1) the first cell and the second cell are both successfully erased or (2) one of the first cell and the second cell is successfully erased and the other one is unsuccessfully erased, it is determined that the erase operation performed on the NAND Flash memory chip is successful; and
         in the event it is determined that (3) the first cell and the second cell are both unsuccessfully erased, it is determined that the erase operation performed on the NAND Flash memory chip is unsuccessful; and
      in the event it is determined that the erase operation performed on the NAND Flash memory chip is unsuccessful:
         reduce the number of bits stored by the first cell from the first number of bits to a second number of bits, wherein the second number of bits is strictly less than the first number of bits; and
         reduce the number of bits stored by the second cell from the first number of bits to the second number of bits.

2. The system of claim 1 further comprising the NAND Flash memory chip.

3. The system of claim 1, wherein the processor is further configured to in the event it is determined that the erase operation performed on the NAND Flash memory chip is unsuccessful, store the second number of bits and an identifier associated with a portion of the NAND flash memory chip that includes the cell.

4. The system of claim 1, wherein the processor is further configured to in the event it is determined that the erase operation performed on the NAND Flash memory chip is unsuccessful, store the second number of bits and an identifier associated with the block of the NAND flash memory chip that includes the first cell and the second cell.

5. The system of claim 3, wherein the interface is further configured to prior to performing a write operation on the NAND Flash memory chip, access the stored second number of bits and the stored identifier associated with the portion of the NAND flash memory chip that includes the cell.

6. The system of claim 4, wherein the interface is further configured to prior to performing a write operation on the NAND Flash memory chip, access the stored second number of bits and the stored identifier associated with the block of the NAND flash memory chip that includes the first cell and the second cell.

7. The system of claim 5, wherein the interface is configured to access the stored second number of bits and the stored identifier associated with the portion of the NAND flash memory chip that includes the cell for all write addresses.

8. The system of claim 6, wherein the interface is configured to access the stored second number of bits and the stored identifier associated with the block of the NAND flash memory chip that includes the first cell and the second cell for all write addresses.

9. A method, comprising:
using a NAND Flash memory controller to perform an erase operation on a NAND Flash memory chip including to a first cell on the NAND Flash memory chip, wherein:
the first cell is configured to store a first number of bits;
the NAND Flash memory chip further includes a second cell which is configured to store the first number of bits; and
the first cell and the second cell are in a same block on the NAND Flash memory chip;
determining whether the erase operation performed on the NAND Flash memory chip is successful, including by determining whether (1) the first cell and the second cell are both successfully erased, (2) one of the first cell and the second cell is successfully erased and the other one is unsuccessfully erased or (3) the first cell and the second cell are both unsuccessfully erased, wherein:
in the event it is determined that (1) the first cell and the second cell are both successfully erased or (2) one of the first cell and the second cell is successfully erased and the other one is unsuccessfully erased, it is determined that the erase operation performed on the NAND Flash memory chip is successful; and
in the event it is determined that (3) the first cell and the second cell are both unsuccessfully erased, it is determined that the erase operation performed on the NAND Flash memory chip is unsuccessful; and
in the event it is determined that the erase operation performed on the NAND Flash memory chip is unsuccessful:
reducing the number of bits stored by the first cell from the first number of bits to a second number of bits, wherein the second number of bits is strictly less than the first number of bits; and
reducing the number of bits stored by the second cell from the first number of bits to the second number of bits.

10. The method of claim 9 further comprising in the event it is determined that the erase operation performed on the NAND Flash memory chip is unsuccessful, storing the second number of bits and an identifier associated with a portion of the NAND flash memory chip that includes the cell.

11. The method of claim 9 further comprising in the event it is determined that the erase operation performed on the NAND Flash memory chip is unsuccessful, storing the second number of bits and an identifier associated with the block of the NAND flash memory chip that includes the first cell and the second cell.

12. The method of claim 9 further comprising prior to performing a write operation on the NAND Flash memory chip, accessing the stored second number of bits and the stored identifier associated with the portion of the NAND flash memory chip that includes the cell.

13. The method of claim 11 further comprising prior to performing a write operation on the NAND Flash memory chip, accessing the stored second number of bits and the stored identifier associated with the block of the NAND flash memory chip that includes the first cell and the second cell.

14. The method of claim 12, wherein accessing the stored second number of bits and the stored identifier associated with the portion of the NAND flash memory chip that includes the cell is performed for all write addresses.

15. The method of claim 13, wherein accessing the stored second number of bits and the stored identifier associated with the block of the NAND flash memory chip that includes the first cell and the second cell is performed for all write addresses.

16. A computer program product, the computer program product being embodied in a tangible, non-transitory computer readable storage medium and comprising computer instructions for:
using a NAND Flash memory controller to perform an erase operation on a NAND Flash memory chip including to a first cell on the NAND Flash memory chip, wherein:
the first cell is configured to store a first number of bits;
the NAND Flash memory chip further includes a second cell which is configured to store the first number of bits; and
the first cell and the second cell are in a same block on the NAND Flash memory chip;
determining whether the erase operation performed on the NAND Flash memory chip is successful, including by determining whether (1) the first cell and the second cell are both successfully erased, (2) one of the first cell and the second cell is successfully erased and the other one is unsuccessfully erased or (3) the first cell and the second cell are both unsuccessfully erased, wherein:
in the event it is determined that (1) the first cell and the second cell are both successfully erased or (2) one of the first cell and the second cell is successfully erased and the other one is unsuccessfully erased, it is determined that the erase operation performed on the NAND Flash memory chip is successful; and
in the event it is determined that (3) the first cell and the second cell are both unsuccessfully erased, it is determined that the erase operation performed on the NAND Flash memory chip is unsuccessful; and
in the event it is determined that the erase operation performed on the NAND Flash memory chip is unsuccessful:
reducing the number of bits stored by the first cell from the first number of bits to a second number of bits, wherein the second number of bits is strictly less than the first number of bits; and
reducing the number of bits stored by the second cell from the first number of bits to the second number of bits.

17. The computer program product of claim 16 further comprising computer instructions for: in the event it is determined that the erase operation performed on the NAND Flash memory chip is unsuccessful, storing the second number of bits and an identifier associated with a portion of the NAND flash memory chip that includes the cell.

18. The computer program product of claim 16 further comprising computer instructions for: in the event it is determined that the erase operation performed on the NAND Flash memory chip is unsuccessful, storing the second number of bits and an identifier associated with the block of the NAND flash memory chip that includes the first cell and the second cell.

19. The computer program product of claim 16 further comprising computer instructions for: prior to performing a write operation on the NAND Flash memory chip, accessing the stored second number of bits and the stored identifier associated with the portion of the NAND flash memory chip that includes the cell.

20. The computer program product of claim 18 further comprising computer instructions for: prior to performing a write operation on the NAND Flash memory chip, accessing the stored second number of bits and the stored identifier associated with the block of the NAND flash memory chip that includes the first cell and the second cell.

* * * * *